United States Patent
Chung et al.

(10) Patent No.: US 10,526,706 B2
(45) Date of Patent: Jan. 7, 2020

(54) GAS SUPPLY UNIT AND THIN FILM DEPOSITION APPARATUS INCLUDING THE SAME

(71) Applicant: SAMSUNG ELECTRONICS CO., LTD., Suwon-si, Gyeonggi-do (KR)

(72) Inventors: Suk Jin Chung, Hwaseong-si (KR); Jong Cheol Lee, Seoul (KR); Jae chul Shin, Suwon-si (KR); Min Hwa Jung, Hwaseong-si (KR); Jin Pil Heo, Pyeongtaek-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 314 days.

(21) Appl. No.: 15/485,433

(22) Filed: Apr. 12, 2017

(65) Prior Publication Data

US 2018/0002808 A1    Jan. 4, 2018

(30) Foreign Application Priority Data

Jun. 30, 2016  (KR) .................. 10-2016-0082310

(51) Int. Cl.
| | |
|---|---|
| *C23C 16/458* | (2006.01) |
| *C23C 16/455* | (2006.01) |
| *C23C 16/44* | (2006.01) |
| *H01L 21/687* | (2006.01) |
| *H01L 21/02* | (2006.01) |
| *H01J 37/32* | (2006.01) |

(52) U.S. Cl.
CPC ...... *C23C 16/4584* (2013.01); *C23C 16/4412* (2013.01); *C23C 16/45544* (2013.01); *C23C 16/45551* (2013.01); *C23C 16/45563* (2013.01); *C23C 16/45565* (2013.01); *H01L 21/0228* (2013.01); *H01L 21/02189* (2013.01); *H01L 21/68764* (2013.01); *H01L 21/68771* (2013.01); *H01J 37/3244* (2013.01)

(58) Field of Classification Search
None
See application file for complete search history.

(56) References Cited

U.S. PATENT DOCUMENTS

| | | | |
|---|---|---|---|
| 8,758,512 | B2 | 6/2014 | Lee |
| 2005/0074983 | A1 | 4/2005 | Shinriki et al. |
| 2006/0073276 | A1 | 4/2006 | Antonissen |
| 2010/0055316 | A1 | 3/2010 | Honma |
| 2010/0310771 | A1 | 12/2010 | Lee |
| 2011/0139074 | A1 | 6/2011 | Kato et al. |
| 2011/0247556 | A1* | 10/2011 | Raring .............. C23C 16/45574 118/713 |
| 2012/0118231 | A1 | 5/2012 | Takagi et al. |
| 2015/0184294 | A1 | 7/2015 | Kato et al. |
| 2015/0307988 | A1 | 10/2015 | Saido et al. |

(Continued)

*Primary Examiner* — Binu Thomas
(74) *Attorney, Agent, or Firm* — Lee & Morse, P.C.

(57) ABSTRACT

A gas supply unit includes a base plate, a plurality of gas supply regions protruding from the base plate and arranged on the base plate in a circumferential direction, and a plurality of sidewall trenches alternating with the gas supply regions on the base plate. A distance between opposing surfaces of the base plate increases in a radial direction from a center of the base plate in each of the plurality of sidewall trenches, so each of the plurality of sidewall trenches has a depth that decreases in the radial direction from the center of the base plate.

20 Claims, 17 Drawing Sheets

(56) References Cited

U.S. PATENT DOCUMENTS

| | | |
|---|---|---|
| 2015/0361553 A1 | 12/2015 | Murakawa |
| 2016/0053373 A1 | 2/2016 | Inada et al. |
| 2016/0060759 A1* | 3/2016 | Kim .................. C23C 16/45574 239/296 |
| 2016/0068952 A1* | 3/2016 | Sasaki ............... C23C 16/45578 118/728 |

* cited by examiner

GAS SUPPLY UNIT AND THIN FILM DEPOSITION APPARATUS INCLUDING THE SAME

CROSS-REFERENCE TO RELATED APPLICATION

Korean Patent Application No. 10-2016-0082310, filed on Jun. 30, 2016, in the Korean Intellectual Property Office, and entitled: "Gas Supply Unit and Thin Film Deposition Apparatus Including the Same," is incorporated by reference herein in its entirety.

BACKGROUND

1. Field

The present disclosure relates to a gas supply unit and a thin film deposition apparatus including the same.

2. Description of the Related Art

As a thin film deposition method for a semiconductor manufacturing process, a process is known which grows a thin film on a substrate, by allowing source gas to be adsorbed onto a surface of a substrate under vacuum, supplying reactant gas that reacts with the source gas so as to allow one or a plurality of atomic layers or molecular layers to be formed on the surface of the substrate by a reaction between the source gas and the reactant gas, and performing this cycle a number of times. For example, this process is called atomic layer deposition (ALD), molecular layer deposition (MLD), or the like (hereinafter, referred to as ALD), and this process is expected as an effective method capable of coping with a semiconductor device with a thin film because this process may highly and precisely control a film thickness in accordance with the number of times of a cycle, and exhibit good in-plane uniformity of a membrane.

SUMMARY

An exemplary embodiment provides a gas supply unit including: a base plate; a plurality of gas supply regions which protrudes on the base plate, and is arranged in a circumferential direction; and a plurality of sidewall trenches which is formed by sidewalls, which face each other, of the gas supply regions adjacent to each other among the plurality of gas supply regions, in which each of the plurality of sidewall trenches has a depth that decreases in a radial direction from a center of the base plate.

Another exemplary embodiment provides a thin film deposition apparatus including: a body; a susceptor which is rotatably disposed in an accommodating groove formed in the body, and supports a plurality of substrates; and a gas supply unit which is coupled to an upper portion of the body so as to face the susceptor, and injects a plurality of gases toward the susceptor, in which the gas supply unit includes: a base plate which faces the susceptor; a plurality of gas supply regions which protrudes on the base plate toward the susceptor, and is sequentially arranged in a circumferential direction so as to be spaced apart from each other; and a plurality of sidewall trenches which is formed by sidewalls, which face each other, of a pair of gas supply regions adjacent to each other among the plurality of gas supply regions, in which the plurality of sidewall trenches has depths that decrease in a radial direction from a center of the base plate.

Yet another exemplary embodiment provides a gas supply unit, including a base plate, a plurality of gas supply regions protruding from the base plate, the plurality of gas supply regions being arranged on the base plate in a circumferential direction, and a plurality of sidewall trenches on the base plate, the plurality of sidewall trenches and the plurality of gas supply regions being alternately arranged along the circumferential direction of the base plate, wherein each of the plurality of sidewall trenches has a decreasing depth in a radial direction from a center of the base plate toward an edge of the base plate.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, a thin film deposition apparatus 10 according to a first exemplary embodiment of the present disclosure will be described with reference to FIGS. 1 to 3.

Figure 1:
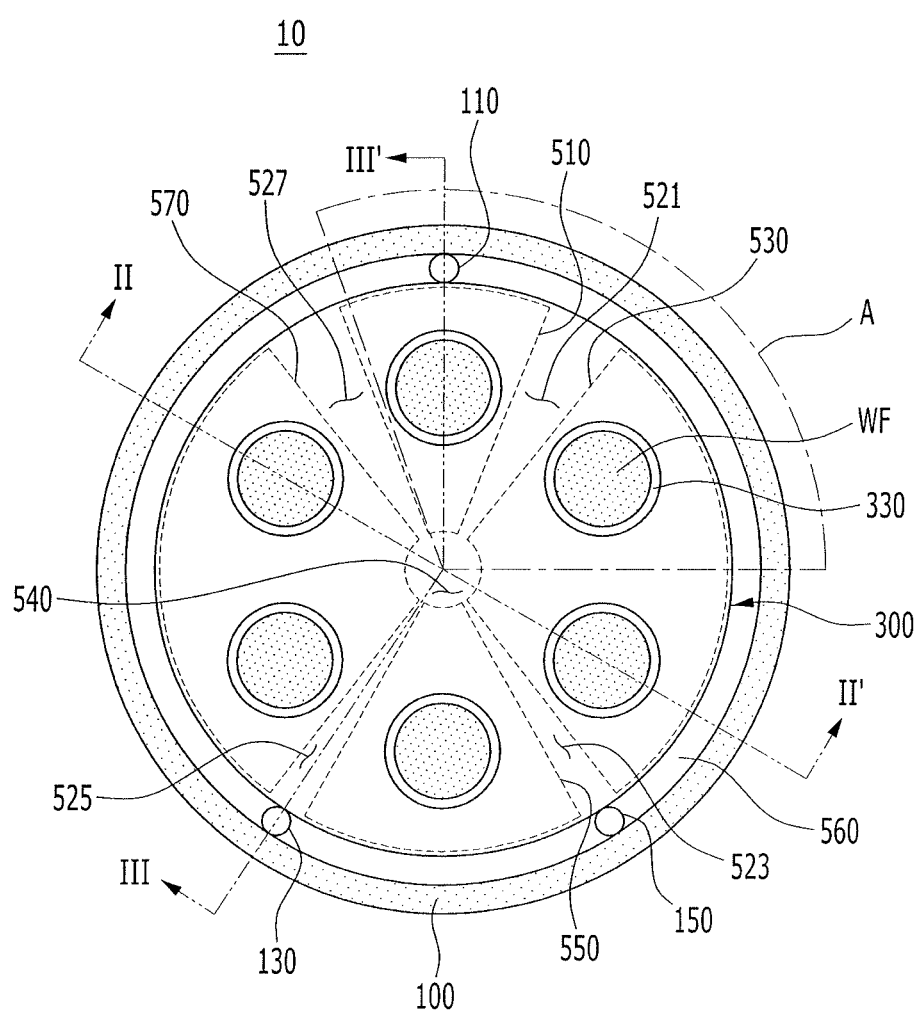
FIG. 1 illustrates a schematic top plan view of a thin film deposition apparatus according to a first exemplary embodiment.
Figure 2:
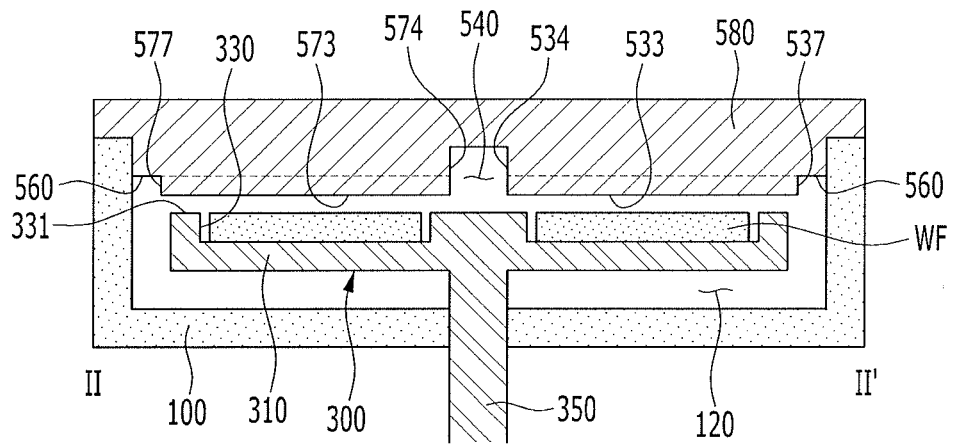
FIG. 2 illustrates a cross-sectional view taken along line II-II' in FIG. 1.
Figure 3:
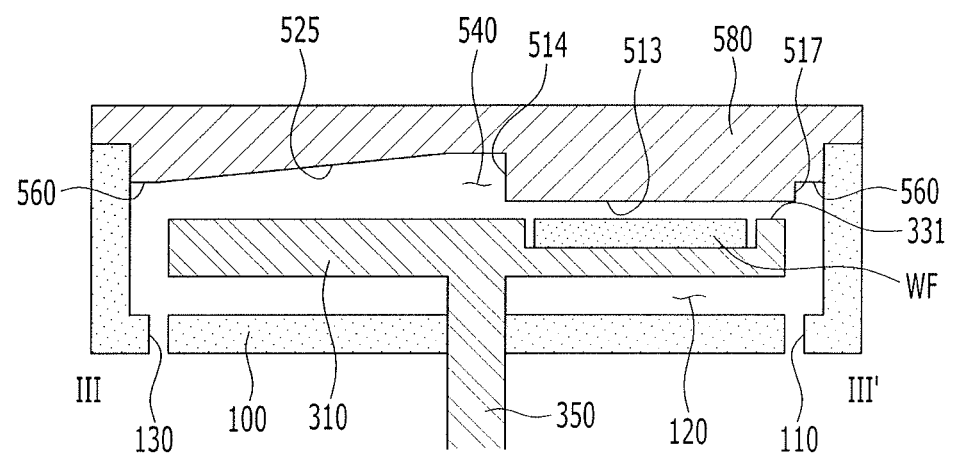
FIG. 3 illustrates a cross-sectional view taken along line in FIG. 1.

FIG. 1 is a schematic top plan view of the thin film deposition apparatus according to the first exemplary embodiment, FIG. 2 is a cross-sectional view taken along line II-II' in FIG. 1, and FIG. 3 is a cross-sectional view taken along line in FIG. 1.

Figure 6:
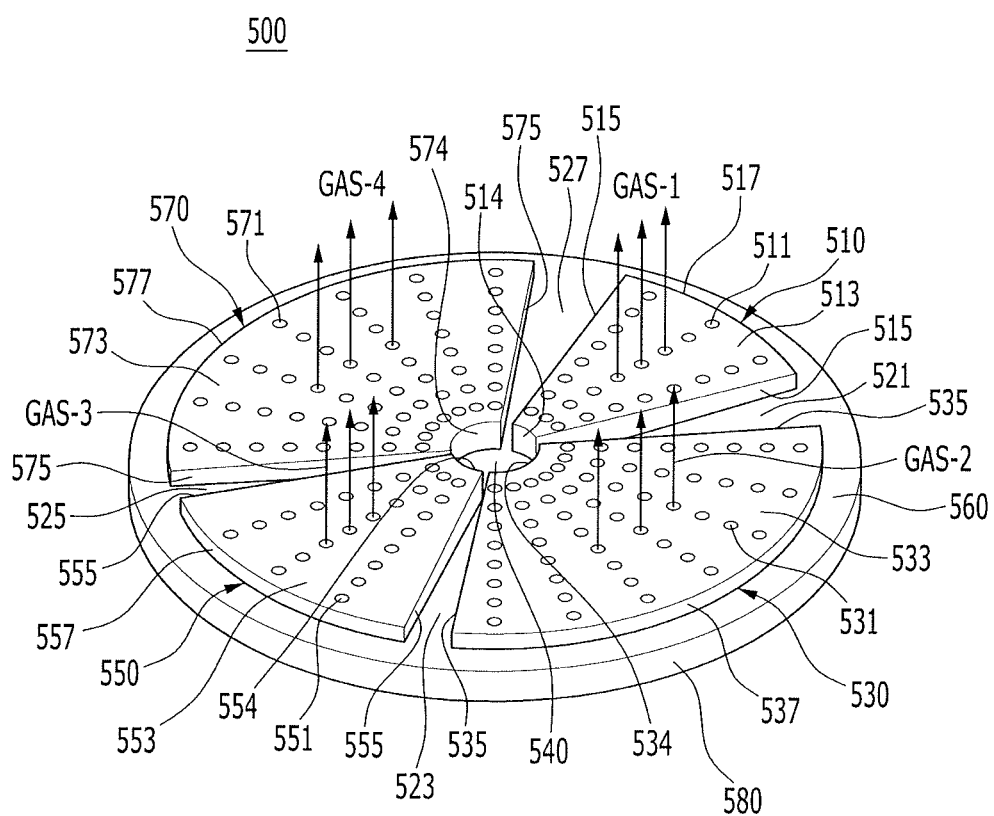
FIG. 6 illustrates a perspective view schematically illustrating a gas supply unit in FIG. 1.

Referring to FIGS. 1 to 3, the thin film deposition apparatus 10 according to the present exemplary embodiment may include a body 100, a susceptor 300, and a gas supply unit 500 (FIG. 6). In the present exemplary embodiment, a central trench 540 and an outer peripheral trench 560 may be formed at a central region and an edge region of the gas supply unit 500, respectively, and sidewall trenches 521, 523, 525, and 527 may be formed between first to fourth gas supply regions 510, 530, 550, and 570 of the gas supply unit 500. Further, depths of the sidewall trenches 521, 523, 525, and 527 may be decreased in a radial direction from a center of the gas supply unit 500, e.g., the sidewall trench 525 may have a decreasing depth from the central trench 540 toward the outer peripheral trench 560 in FIG. 3.

With the shapes and the arrangement of the trenches 521, 523, 525, 527, 540, and 560, the gases injected from the first to fourth gas supply regions 510, 530, 550, and 570 to the susceptor 300 uniformly move from a center of a substrate WF to an edge of the substrate WF. In detail, the gases may move from the center of the substrate WF toward a central region of the susceptor 300 and an edge region of the susceptor 300, and in a direction which intersects an imaginary line that connects the central region of the susceptor 300 and the edge of the susceptor 300. Therefore, the gases may be uniformly deposited onto the substrate WF.

The body 100 may be, e.g., a cylindrical, container in which a deposition process is carried out, and an accommodating groove 120, which may accommodate the susceptor 300, may be formed in the body 100. For example, as illustrated in FIG. 2, the body 100 may include a space therein, e.g., the accommodating groove 120, to accommodate the susceptor 300. However, in the present disclosure, the shape of the body 100 is not limited thereto, and the body 100 may be formed as a container having various shapes.

The body 100 may be made of metal having corrosion resistance. It is possible to prevent the body 100 from being corroded or eroded by source gas or reactant gas supplied from the gas supply unit 500.

A first gas discharge port 110 and second gas discharge ports 130 and 150, which discharge gas supplied from the gas supply unit 500, may be formed in, e.g., through, a bottom surface of the accommodating groove 120 of the body 100. The first gas discharge port 110 and the second gas discharge ports 130 and 150 may be disposed to face the outer peripheral trench 560 of the gas supply unit 500 which will be described below. That is, the first gas discharge port 110 and the second gas discharge ports 130 and 150 may be disposed below the outer peripheral trench 560 so as to face the outer peripheral trench 560, e.g., the first gas discharge port 110 and the second gas discharge ports 130 and 150 may connect between the outer peripheral trench 560 and the outside of the body 110 to allow fluid communication therebetween.

The gas supply unit 500, which supplies source gas, reactant gas, and purge gas into the body 100, may be coupled to an upper portion of the body 100. In this case, the gas supply unit 500 covers an open upper side of the body 100, thereby sealing an interior of the body 100 so as to be in a vacuum state in the interior of the body 100. A detailed structure of the gas supply unit 500 will be described below with reference to FIG. 6.

The susceptor 300 may be positioned in the accommodating groove 120 of the body 100 while supporting the plurality of substrates WF for forming thin films. For example, the susceptor 300 may be rotatably disposed in the accommodating groove 120. For example, the susceptor 300 may rotate while gas is injected from the gas supply unit 500.

Figure 4:
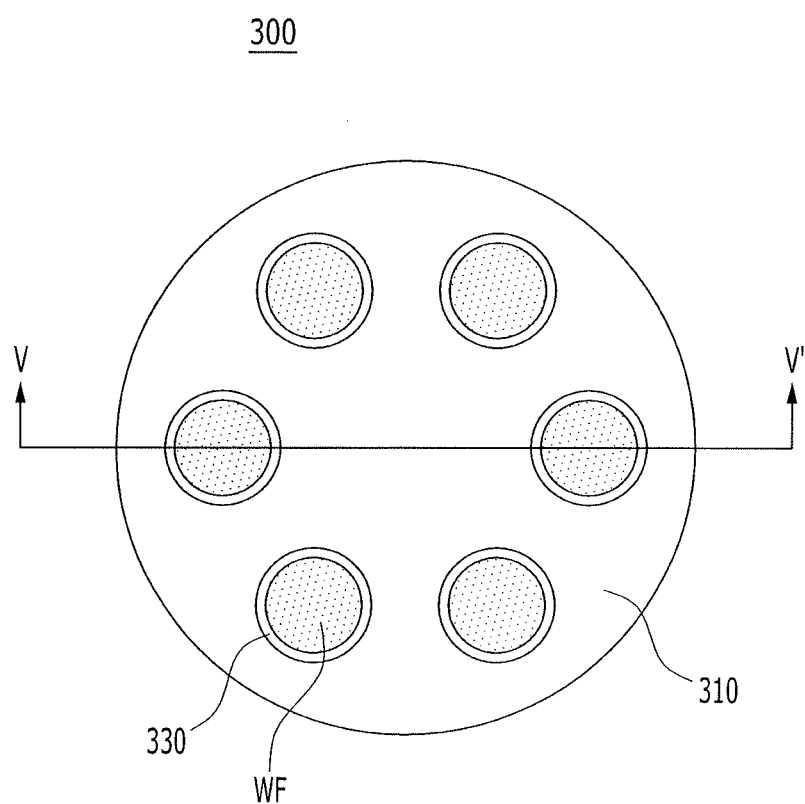
FIG. 4 illustrates a top plan view schematically illustrating a susceptor in FIG. 1.

The susceptor 300 will be described hereinafter with reference to FIGS. 4-5. FIG. 4 illustrates a top plan view of the susceptor 300, and FIG. 5 illustrates a cross-sectional view taken along line V-V' in FIG. 4.

Figure 5:
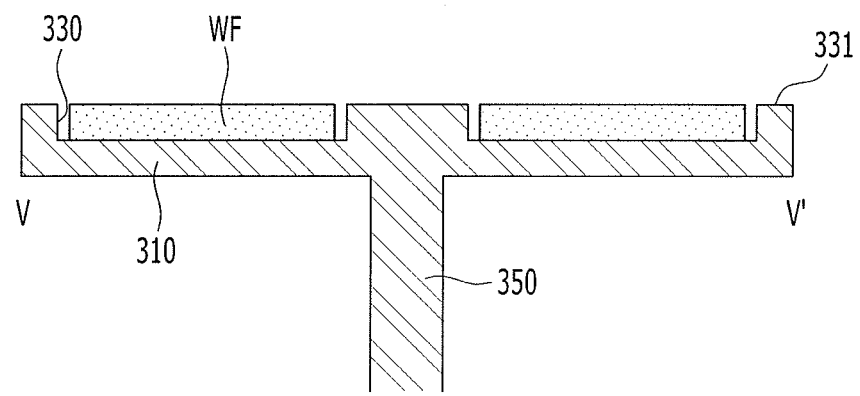
FIG. 5 illustrates a cross-sectional view taken along line V-V' in FIG. 4.

Referring to FIGS. 4 and 5, a support plate 310 of the susceptor 300 may have, e.g., a circular cross section in top plan view. A loading groove 330, which may accommodate the substrate WF, may be formed in the support plate 310. The loading groove 330 may have a shape corresponding to a shape of the substrate WF to be accommodated in the loading groove 330. For example, the loading groove 330 may have a circular shape so as to correspond to the substrate WF having a circular shape.

In the present exemplary embodiment, an upper surface of the substrate WF accommodated in the loading groove 330 and an upper surface 331 of the support plate 310 may be disposed at the same level (FIG. 5). That is, the upper surface of the substrate WF and the upper surface 331 of the support plate 310 may form the same plane. However, the present disclosure is not limited thereto, and the upper surface of the substrate WF may protrude upward from the upper surface 331 of the support plate 310.

That is, a height of the upper surface of the substrate WF may be equal to or greater than a height of the upper surface 331 of the support plate 310. If a height of the upper surface of the substrate WF is smaller than a height of the upper surface 331 of the support plate 310, the gas injected to the upper surface of the substrate WF may be trapped in the loading groove 330 instead of being spread out along the upper surface 331 of the support plate 310, thereby minimizing height uniformity of deposition layers deposited onto the substrate WF.

Meanwhile, like the body 100, the susceptor 300 may also be made of metal having corrosion resistance. It is possible to prevent the susceptor 300 from being corroded or eroded by source gas or reactant gas supplied by the gas supply unit 500.

In this case, one or more loading grooves 330 may be provided to accommodate the plurality of substrates WF. In the present exemplary embodiment, six loading grooves 330 are illustrated as being formed in the support plate 310, but the present disclosure is not limited thereto, and the number of loading grooves 330 may be below six, or seven or more. The plurality of loading grooves 330 may be formed in the support plate 310, e.g., in a circumferential direction. The plurality of loading grooves 330 may be disposed at predetermined intervals.

A rotating shaft 350 may be coupled to a lower portion of the support plate 310 of the body 100. The rotating shaft 350 is disposed at the center of the support plate 310, and may be connected with a drive unit through the body 100.

Figure 7:
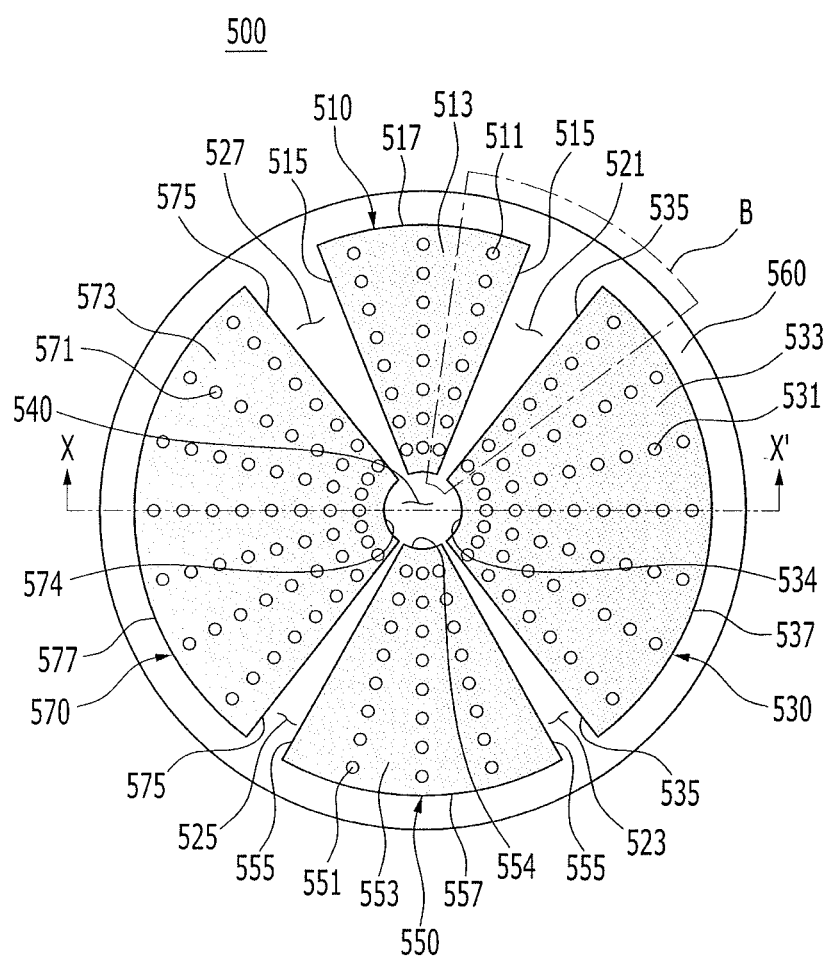
FIG. 7 illustrates a top plan view schematically illustrating the gas supply unit in FIG. 6.
Figure 8:
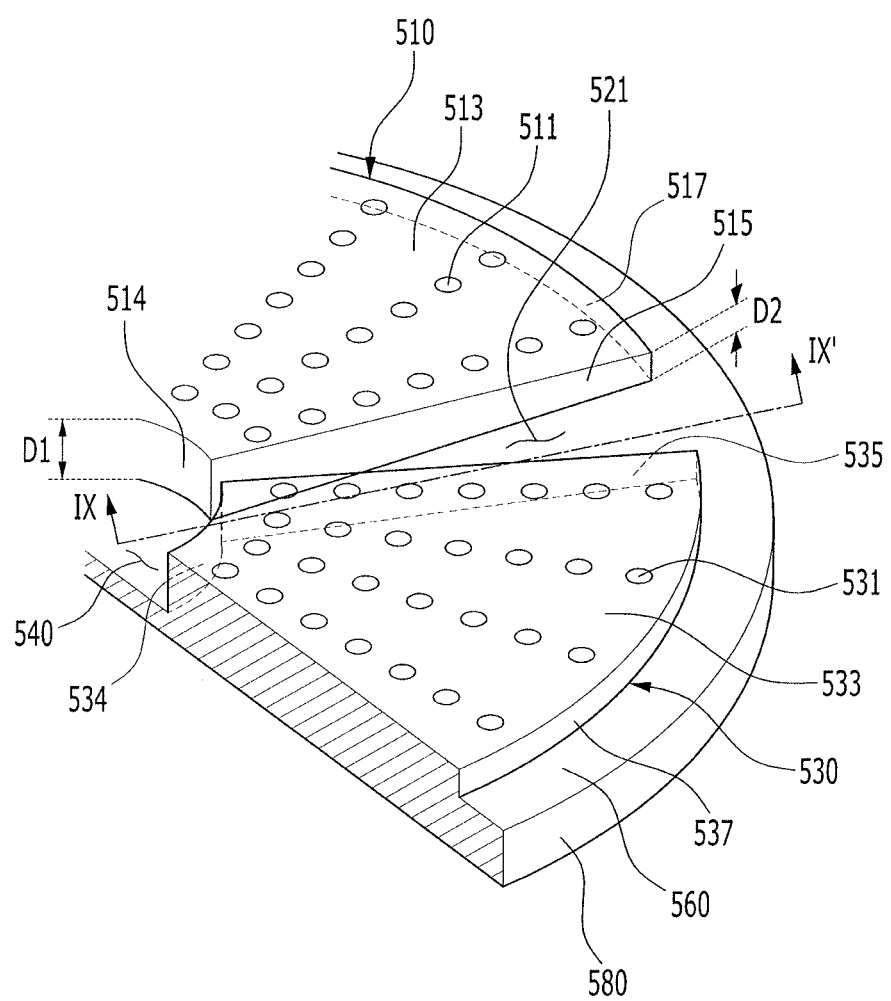
FIG. 8 illustrates a schematic perspective view illustrating enlarged region B in FIG. 7.
Figure 9:
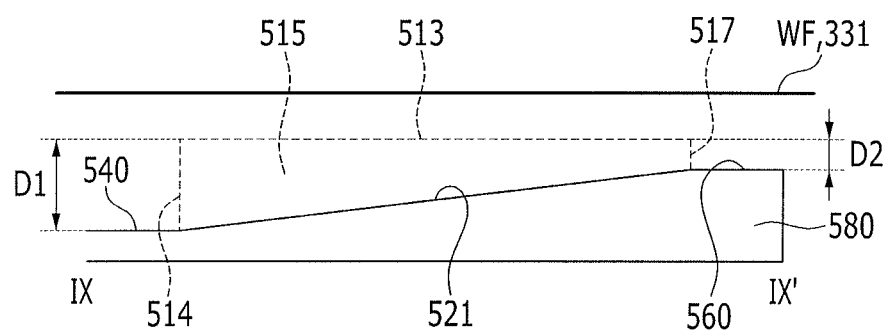
FIG. 9 illustrates a cross-sectional view taken along line IX-IX' in FIG. 8.
Figure 10:
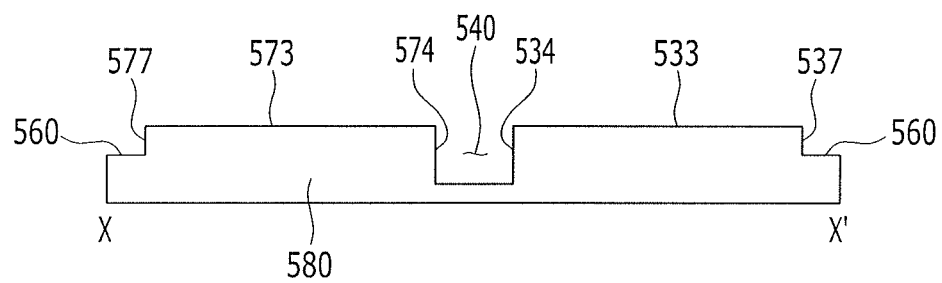
FIG. 10 illustrates a cross-sectional view taken along line X-X' in FIG. 7.

The gas supply unit 500 will be described hereinafter with reference to FIGS. 6-10. FIG. 6 illustrates a perspective view of the gas supply unit 500, and FIG. 7 illustrates a top plan view of the gas supply unit 500. FIG. 8 illustrates a schematic perspective view of an enlarged region B in FIG. 7, FIG. 9 illustrates a cross-sectional view taken along line IX-IX' in FIG. 8, and FIG. 10 illustrates a cross-sectional view taken along line X-X' in FIG. 7.

Referring to FIGS. 6 to 10, the gas supply unit 500 may include a base plate 580, the first to fourth gas supply regions 510, 530, 550, and 570, the first to fourth sidewall trenches 521, 523, 525, and 527, the central trench 540, and the outer peripheral trench 560. For example, as illustrated in FIG. 6, the first to fourth sidewall trenches 521, 523, 525, and 527, as well as the central trench 540 may extend through an entire thickness of the first to fourth gas supply regions 510, 530, 550, and 570. Further, as illustrated in FIG. 2, the gas supply unit 500 may be positioned above the susceptor 300 with the first to fourth gas supply regions 510, 530, 550, and 570 between the susceptor 300 and the base plate 580.

The base plate 580 may have, e.g., a circular horizontal cross section. The base plate 580 corresponds to a shape of the susceptor 300, and thus may have the same circular shape as the susceptor 300. When the gas supply unit 500 is coupled to the upper portion of the body 100, the base plate 580 may be disposed to face the susceptor 300.

The first gas supply region 510, the second gas supply region 530, the third gas supply region 550, and the fourth gas supply region 570 may be disposed on the base plate 580. The first gas supply region 510, the second gas supply region 530, the third gas supply region 550, and the fourth gas supply region 570 may be sequentially disposed on the base plate 580 in the circumferential direction. For example, as illustrated in FIG. 6, the first gas supply region 510, the second gas supply region 530, the third gas supply region 550, and the fourth gas supply region 570 may be sequentially disposed clockwise, e.g., with each of the first to fourth gas supply regions 510, 530, 550, and 570 being directly on the base plate 580. For example, as illustrated in FIG. 7, each of the second gas supply region 530 and the fourth gas supply region 570 may be between the first and third gas supply regions 510 and 550, e.g., so the first and third gas supply regions 510 and 550 may be opposite each other across the central trench 540.

As further illustrated in FIG. 6, the first gas supply region 510, the second gas supply region 530, the third gas supply region 550, and the fourth gas supply region 570 may be disposed to be spaced apart from each other via the sidewalls trenches. The first gas supply region 510, the second gas supply region 530, the third gas supply region 550, and the fourth gas supply region 570 may supply the susceptor 300 with different types of gas or the same gas.

The first gas supply region 510 may supply a first gas GAS-1 toward the susceptor 300. For example, the first gas GAS-1 may be a source gas, and may be gas including a metal precursor used for an atomic layer deposition process. For example, the first gas GAS-1 may include Zr. More specifically, as the first gas GAS-1, TEMAZ [tetra-ethylmethyl amino zirconium; $Zr(N(CH_3)(C_2H_5))_4$], TDEAZ [tetrakis-diethylamino-zirconium; $Zr(N(C_2H_5)_2)_4$], or TEMAZ [tetrakis-methylethylamino-zirconium; $Zr(N(CH_3)(C_2H_5))_4$] may be used.

The third gas supply region 550 may supply a third gas GAS-3 toward the susceptor 300. For example, the third gas GAS-3 may be a reactant gas that reacts with the source gas, i.e., with the first gas GAS-1. For example, the third gas GAS-3 may be a non-metal reactant gas that reacts with the metal precursor in the first gas GAS-1. For example, the third gas GAS-3 may include at least one of $O_3$, $O_2$, and $H_2O$.

The second gas supply region 530 and the fourth gas supply region 570 supply second gas GAS-2 and fourth gas GAS-4, respectively, and the second gas GAS-2 and the fourth gas GAS-4 may be purge gas. For example, the purge gas may be an inert gas, e.g., argon gas or nitrogen gas.

In this case, the purge gas, which is the second gas GAS-2 and the fourth gas GAS-4, may discharge the first gas GAS-1 and the second gas GAS-2, which are not attached to the substrate WF, to the outside. In addition, the second gas GAS-2 and the fourth gas GAS-4 may prevent the first gas GAS-1 and the third gas GAS-3, which are supplied from the first gas supply region 510 and the third gas supply region 550, respectively, from being mixed together. That is, the second gas GAS-2 and the fourth gas GAS-4 are injected between the first gas supply region 510 and the third gas supply region 550, and serve as curtains, e.g., partitions, between the first gas GAS-1 and the third gas GAS-3.

The thin film deposition apparatus according to the present exemplary embodiment may be applied to form a capacitor of a semiconductor device. More specifically, the thin film deposition apparatus according to the present exemplary embodiment may be used to form a dielectric film that constitutes a capacitor. In the case of the capacitor of the semiconductor device, a lower electrode is formed on the substrate WF, and a dielectric film is then formed on the lower electrode. Further, an upper electrode is formed on the dielectric film.

For example, the thin film deposition apparatus according to the present exemplary embodiment stacks an atomic layer by using TEMAZ, which is the first gas GAS-1, and $O_3$, which is the third gas GAS-3, thereby forming the dielectric film on the lower electrode. That is, the thin film deposition apparatus according to the present exemplary embodiment allows TEMAZ, which is the first gas GAS-1, and $O_3$, which is the third gas GAS-3, to react with each other, thereby forming the dielectric film, which is formed as a thin film including zirconium oxide, on the lower electrode.

Meanwhile, in the present exemplary embodiment, the first gas supply region 510 and the third gas supply region 550 have different areas. Here, an area of the gas supply region refers to a size of an area of an upper surface of the gas supply region, which will be described below, when viewing the gas supply unit 500 in plan view, e.g., an area of the first gas supply region 510 may be larger than an area of the third gas supply region 550.

In detail, an area ratio between the first gas supply region 510 and the third gas supply region 550 may be about 1:1.4 to about 1:2, e.g., an area ratio between the first gas supply region 510 and the third gas supply region 550 may be about 1:1.7. As described above, if the first gas supply region 510, which supplies the first gas GAS-1, and the third gas supply region 550, which supplies the third gas GAS-3, have the area ratio within the aforementioned range, it is possible to improve electrical properties, e.g., permittivity of the dielectric film formed by the reaction between the source gas, which is the first gas GAS-1, and the reactant gas, which is the third gas GAS-3.

In this case, the second gas supply region 530 and the fourth gas supply region 570 may be formed to have a same area, e.g., a same area size that is larger than each of the areas of the first and third gas supply regions 510 and 550. However, the present disclosure is not limited thereto, and the second gas supply region 530 and the fourth gas supply region 570 may have different areas.

In this case, the first gas supply region 510, the second gas supply region 530, the third gas supply region 550, and the fourth gas supply region 570 may protrude on the base plate 580. The first gas supply region 510, the second gas supply region 530, the third gas supply region 550, and the fourth gas supply region 570 may protrude toward the susceptor 300.

For example, the first gas supply region 510, the second gas supply region 530, the third gas supply region 550, and the fourth gas supply region 570 may be formed integrally with the base plate 580. In another example, the first gas supply region 510, the second gas supply region 530, the third gas supply region 550, and the fourth gas supply region 570 may be separately formed from the base plate 580, and disposed by being attached to the base plate 580.

The first gas supply region 510 may include a first upper surface 513, a first inner wall 514, a first outer wall 517, and first sidewalls 515. The first upper surface 513 is a flat surface that faces the susceptor 300, and a plurality of first gas injection holes 511 may be formed in the first upper surface 513. The first gas GAS-1 may be injected toward the susceptor 300 through the plurality of first gas injection holes 511.

The first inner wall 514 is a surface directed toward the center of the base plate 580, e.g., toward the central trench 514. A line, where the first inner wall 514 and the first upper surface 513 meet together, may define an arc when viewed in plan view.

The first sidewalls 515 may be sidewalls that face the second gas supply region 530 and the fourth gas supply region 570, respectively. A pair of first sidewalls 515 may be provided. One of the pair of first sidewalls 515 may face a second sidewall 535 of the second gas supply region 530. Further, the other of the pair of first sidewalls 515 may face a fourth sidewall 575 of the fourth gas supply region 570. The pair of first sidewalls 515 may extend from both end portions of the first inner wall 514, respectively. In this case, the first sidewalls 515 may extend in a radial direction of the base plate 580 from the center of the base plate 580.

The first outer wall 517 is a surface directed toward an edge of the base plate 580. Like the first inner wall 514, a line, where the first outer wall 517 and the first upper surface 513 meet together, may define an arc when viewed in plan view.

With the shapes and the arrangement of the first upper surface 513, the first inner wall 514, the first outer wall 517, and the first sidewalls 515 of the first gas supply region 510, a width in a circumferential direction of the first gas supply region 510 may gradually increase in the radial direction from the center of the base plate 580. The first gas supply region 510 may have a shape similar to a fan shape when viewed in plan view.

The second gas supply region 530 may include a second upper surface 533, a second inner wall 534, a second outer wall 537, and the second sidewall 535. The second upper surface 533 is a flat surface that faces the susceptor 300, and may be coplanar with the first upper surface 513 of the first gas supply region 510.

A plurality of second gas injection holes 531 may be formed in the second upper surface 533. The second gas GAS-2 may be injected toward the susceptor 300 through the plurality of second gas injection holes 531.

Like the first inner wall 514 of the first gas supply region 510, the second inner wall 534 is a surface directed toward the center of the base plate 580. A line, where the second inner wall 534 and the second upper surface 533 meet together, may define an arc when viewed in plan view.

The second sidewalls 535 may be sidewalls that face the first gas supply region 510 and the third gas supply region 550, respectively. A pair of second sidewalls 535 may be provided. One sidewall of the pair of second sidewalls 535 may face the first sidewall 515 of the first gas supply region 510. The other sidewall may face a third sidewall 555 of the third gas supply region 550. The pair of second sidewalls 535 may extend from both end portions of the second inner wall 534, respectively. In this case, the second sidewalls 535 may extend in the radial direction of the base plate 580 from the center of the base plate 580.

The second outer wall 537 is a surface directed toward the edge of the base plate 580, and like the second inner wall 534. A line, where the second outer wall 537 and the second upper surface 533 meet together, may define an arc when viewed in plan view.

Like the first gas supply region 510, a width in the circumferential direction of the second gas supply region 530 may gradually increase in the radial direction from the center of the base plate 580. The second gas supply region 530 may have a shape similar to a fan shape when viewed in plan view.

The third gas supply region 550 may include a third upper surface 553, a third inner wall 554, a third outer wall 557, and the third sidewalls 555. The third upper surface 553 is a flat surface that faces the susceptor 300, and may be coplanar with the first upper surface 513 of the first gas supply region 510 and the second upper surface 533 of the second gas supply region 530.

A plurality of third gas injection holes 551 may be formed in the third upper surface 553. The third gas GAS-3 may be injected toward the susceptor 300 through the plurality of third gas injection holes 551.

Like the first inner wall 514 and the second inner wall 534, the third inner wall 554 is a surface directed toward the center of the base plate 580. A line, where the third inner wall 554 and the third upper surface 553 meet together, may define an arc when viewed in plan view.

The third sidewalls 555 may be sidewalls that face the second gas supply region 530 and the fourth gas supply region 570, respectively. A pair of third sidewalls 555 may be provided. One sidewall of the pair of third sidewalls 555 may face the second sidewall 535 of the second gas supply region 530. The other sidewall may face the fourth sidewall 575 of the fourth gas supply region 570. The pair of third sidewalls 555 may extend from both end portions of the third inner wall 554, respectively. In this case, the third sidewalls 555 may extend in the radial direction of the base plate 580 from the center of the base plate 580.

The third outer wall 557 is a surface directed toward the edge of the base plate 580, and like the third inner wall 554. A line, where the third outer wall 557 and the third upper surface 553 meet together, may define an arc when viewed in plan view.

Like the first gas supply region 510 and the second gas supply region 530, a width in the circumferential direction of the third gas supply region 550 may gradually increase in the radial direction from the center of the base plate 580. The third gas supply region 550 may have a shape similar to a fan shape when viewed in plan view.

The fourth gas supply region 570 may include a fourth upper surface 573, a fourth inner wall 574, a fourth outer wall 577, and the fourth sidewalls 575. The fourth upper surface 573 is a flat surface that faces the susceptor 300, and may be coplanar with the first upper surface 513, the second upper surface 533, and the third upper surface 553.

A plurality of fourth gas injection holes 571 may be formed in the fourth upper surface 573. The fourth gas GAS-4 may be injected toward the susceptor 300 through the plurality of fourth gas injection holes 571.

Like the first inner wall 514, the second inner wall 534, and the third inner wall 554, the fourth inner wall 574 is a surface directed toward the center of the base plate 580. A line, where the fourth inner wall 574 and the fourth upper surface 573 meet together, may define an arc when viewed in plan view.

The fourth sidewalls 575 may be sidewalls that face the third gas supply region 550 and the first gas supply region 510, respectively. A pair of fourth sidewalls 575 may be provided. One sidewall of the pair of fourth sidewalls 575 may face the third sidewall 555 of the third gas supply region 550. The other sidewall may face the first sidewall 515 of the first gas supply region 510.

The pair of fourth sidewalls 575 may extend from both end portions of the fourth inner wall 574, respectively. In this case, the fourth sidewalls 575 may extend in the radial direction of the base plate 580 from the center of the base plate 580.

The fourth outer wall 577 is a surface directed toward the edge of the base plate 580, and like the fourth inner wall 574, a line, where the fourth outer wall 577 and the fourth upper surface 573 meet together, may define an arc when viewed in plan view.

Like the first gas supply region 510, the second gas supply region 530, and the third gas supply region 550, a width in the circumferential direction of the fourth gas supply region 570 may gradually increase in the radial direction from the center of the base plate 580. The fourth gas supply region 570 may also have a shape similar to a fan shape when viewed in plan view.

In the present exemplary embodiment, the first sidewall trench 521 may be formed between the first gas supply region 510 and the second gas supply region 530. More specifically, the first sidewall trench 521 may be defined by the base plate 580, and the first sidewall 515 of the first gas supply region 510 and the second sidewall 535 of the second gas supply region 530 which face each other.

The first sidewall trench 521 may extend in the radial direction from the center of the base plate 580. That is, the first sidewall trench 521 may have a shape that extends in the radial direction.

Referring to FIGS. 8 and 9, a depth of the first sidewall trench 521 may decrease in the radial direction from the center of the base plate 580. Here, the depth of the first sidewall trench 521 refers to a vertical distance from the first upper surface 513 of the first gas supply region 510 to the upper surface of the base plate 580.

In the present exemplary embodiment, the depth of the first sidewall trench 521 increases toward the center of the base plate 580, and decreases toward the edge of the base plate 580. In this case, the depth of the first sidewall trench 521 may continuously decrease in the radial direction from the center of the base plate 580. However, the present disclosure is not limited thereto, and the depth of the first sidewall trench 521 may decrease in a stepwise manner. For example, the depth of the first sidewall trench 521 may change in a stepwise manner.

A ratio between a maximum depth and a minimum depth of the first sidewall trench 521 may be about 4:1 to about 6: e.g., a ratio between a maximum depth and a minimum depth of the first sidewall trench 521 may be about 5:1. Specifically, the first sidewall trench 521 may have a first depth D1 which is a maximum depth adjacent to the center of the base plate 580, and a second depth D2 which is a minimum depth adjacent to the edge of the base plate 580. In this case, a ratio between the first depth D1 and the second depth D2 may be about 4:1 to about 6:1.

In the present exemplary embodiment, if the first sidewall trench 521 is formed to have the aforementioned structure, a volume of the first sidewall trench 521 in a region close to the center of the base plate 580 in the present exemplary embodiment may increase. e.g., in comparison with a sidewall trench that has a uniform depth.

Figure 11:
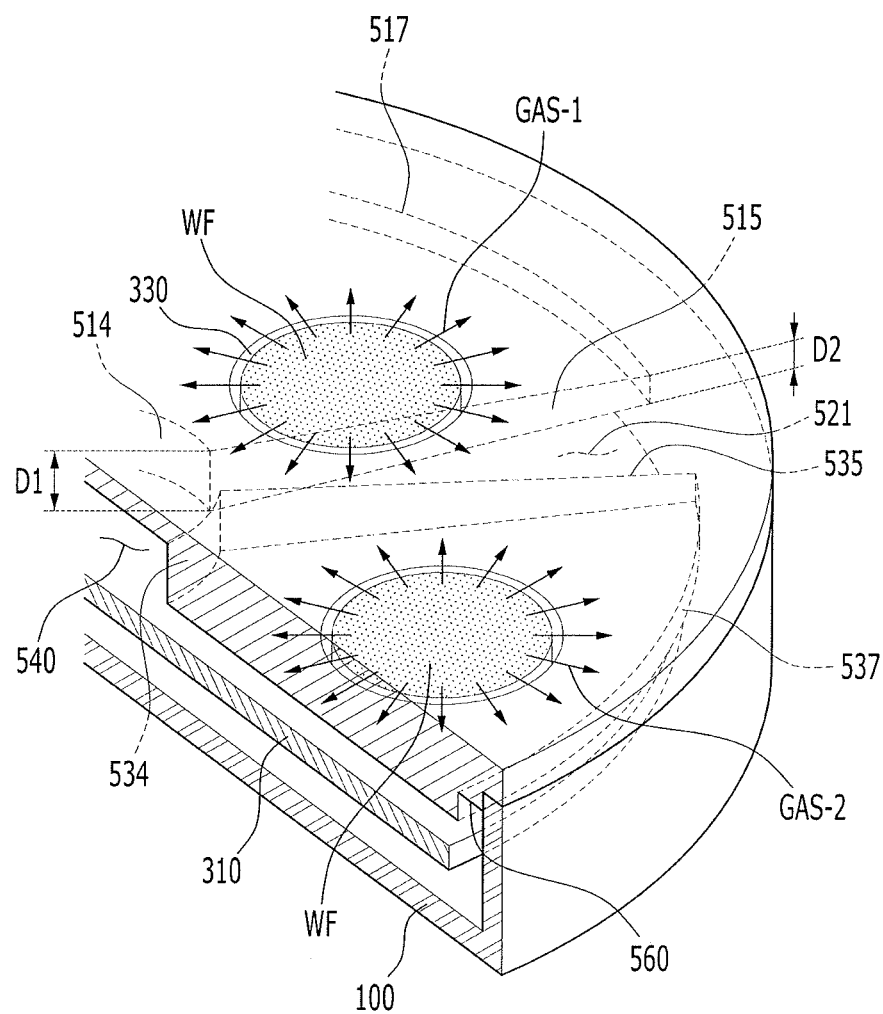
FIG. 11 illustrates a view for explaining a gas flow in region A in FIG. 1.

FIG. 11 is a view illustrating an enlarged partial region in which the gas supply unit 500 is coupled above the susceptor 300. Referring to FIG. 11, if the depth of the first sidewall trench 521 increases in a region close to the center of the base plate 580, pressure in the region decreases, e.g., in comparison with a comparable structure having a sidewall trench with a uniform depth. Therefore, according to Bernoulli's theorem, a flow velocity of gas increases in the region close to the center of the base plate 580, i.e., where pressure decreases, and the amount of gas flowing to the region increases.

Accordingly, in the present exemplary embodiment, a large amount of the first gas GAS-1 discharged from the first gas supply region 510 may move to the region close to the center of the base plate 580 e.g., in comparison with a comparable structure having a sidewall trench with a uniform depth. Therefore, the first gas GAS-1, which is injected through the first gas injection holes 511 of the first gas supply region 510, may be uniformly spread out in all directions based on the center of the substrate WF placed on the susceptor 300. As a result, the first gas GAS-1 may be uniformly deposited onto the substrate WF. This phenomenon occurs not only in the first sidewall trench 521 of the first gas supply region 510, but also in the second sidewall trench 523, the third sidewall trench 525, and the fourth sidewall trench 527.

Figure 12A:
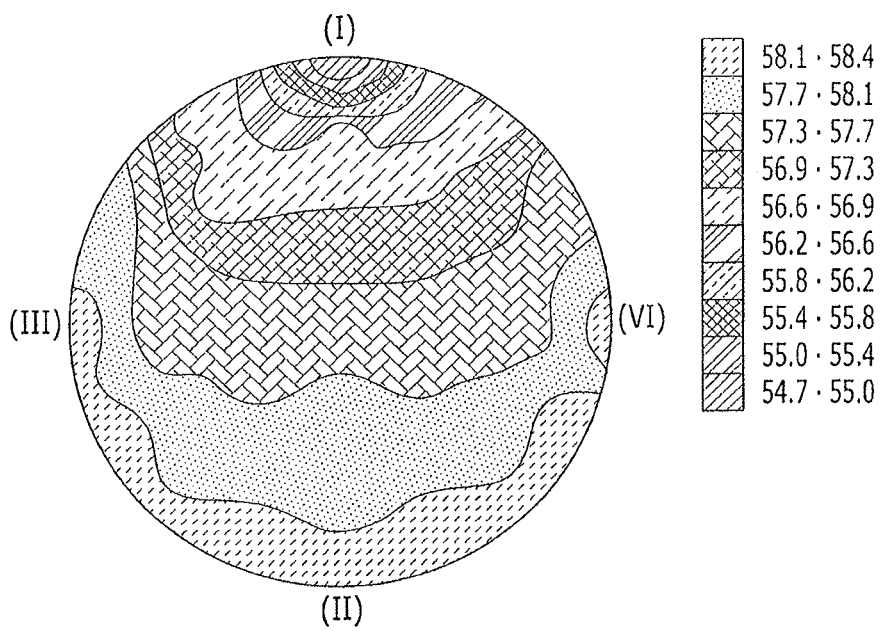
FIGS. 12A and 12B illustrate a result of comparing deposition uniformity between thin film deposition apparatuses according to the present exemplary embodiment and a Comparative Example, respectively.
Figure 12B:
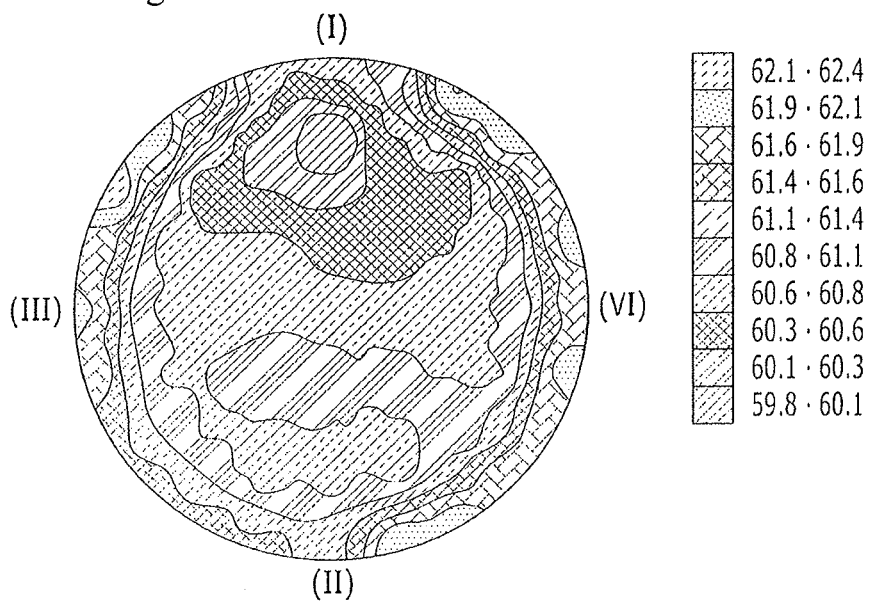

FIGS. 12A and 12B are views illustrating measured uniformity of the deposition on the substrate WF which is made by a thin film deposition apparatus having a comparable structure to the thin film deposition apparatus 10, but has sidewall trenches with uniform depths (FIG. 12A), and the thin film deposition apparatus 10 according to the present exemplary embodiment (FIG. 12B). Here, the deposition uniformity is a result of measuring thicknesses of the thin film deposited onto the substrate WF for each position.

Referring to FIG. 12A, in a case in which a thin film is formed on the substrate WF by using a thin film deposition apparatus having sidewall trenches with uniform depths, a deposition thickness increases from a first position I closer to the center of the base plate 580 to a second position II closer to the edge of the base plate 580. That is, the thickness of the deposited thin film tends to decrease toward the position closer to the center of the base plate 580. However, deposition thicknesses are comparatively similar to each other at a third position III and a fourth position IV which are positioned at left and right sides of the substrate WF, respectively.

In contrast, referring to FIG. 12B, the thicknesses of the deposited thin films may be comparatively uniform at positions spaced apart from the center of the substrate WF at the same distance, in comparison with FIG. 12A. That is, the thin film deposition apparatus according to the present exemplary embodiment may maintain a comparatively uniform thickness of the thin film deposited onto the substrate WF.

Referring back to FIGS. 6 and 7, the second sidewall trench 523 may be formed between the second gas supply region 530 and the third gas supply region 550. More specifically, the second sidewall trench 523 may be defined by the base plate 580, and the second sidewall 535 of the second gas supply region 530 and the third sidewall 555 of the third gas supply region 550 which face each other.

The second sidewall trench 523 may extend in the radial direction from the center of the base plate 580. That is, the second sidewall trench 523 may have a shape that extends in the radial direction.

Like the first sidewall trench 521, a depth of the second sidewall trench 523 may decrease in the radial direction from the center of the base plate 580. In the present exemplary embodiment, the depth of the second sidewall trench 523 increases toward the center of the base plate 580, and decreases toward the edge of the base plate 580.

In this case, like the first sidewall trench 521, the depth of the second sidewall trench 523 may continuously decrease in the radial direction from the center of the base plate 580. However, the present disclosure is not limited thereto, and the depth of the second sidewall trench 523 may decrease in a stepwise manner. For example, the depth of the second sidewall trench 523 may change in a stepwise manner.

A ratio between a maximum depth and a minimum depth of the second sidewall trench 523 may be about 4:1 to about 6:1, e.g., a ratio between a maximum depth and a minimum depth of the second sidewall trench 523 may be about 5:1. Specifically, the second sidewall trench 523 may have the first depth D1 which is a maximum depth adjacent to the center of the base plate 580, and the second depth D2 which is a minimum depth adjacent to the edge of the base plate 580. In this case, a ratio between the first depth D1 and the second depth D2 may be about 4:1 to about 6:1.

In addition, the third sidewall trench 525 may be formed between the third gas supply region 550 and the fourth gas supply region 570. More specifically, the third sidewall trench 525 may be defined by the base plate 580, and the third sidewall 555 of the third gas supply region 550 and the fourth sidewall 575 of the fourth gas supply region 570 which face each other.

The third sidewall trench 525 may extend in the radial direction from the center of the base plate 580. That is, the third sidewall trench 525 may have a shape that extends in the radial direction.

Like the first sidewall trench 521 and the second sidewall trench 523, a depth of the third sidewall trench 525 may decrease in the radial direction from the center of the base plate 580. In the present exemplary embodiment, the depth of the third sidewall trench 525 increases toward the center of the base plate 580, and decreases toward the edge of the base plate 580.

In this case, like the first sidewall trench 521 and the second sidewall trench 523, the depth of the third sidewall trench 525 may continuously decrease in the radial direction from the center of the base plate 580. However, the present disclosure is not limited thereto, and the depth of the third sidewall trench 525 may decrease in a stepwise manner. For example, the depth of the third sidewall trench 525 may change in a stepwise manner.

A ratio between a maximum depth and a minimum depth of the third sidewall trench 525 may be about 4:1 to about 6:1, e.g., a ratio between a maximum depth and a minimum depth of the third sidewall trench 525 may be about 5:1. Specifically, the third sidewall trench 525 may have the first depth D1 which is a maximum depth adjacent to the center of the base plate 580, and the second depth D2 which is a minimum depth adjacent to the edge of the base plate 580. In this case, a ratio between the first depth D1 and the second depth D2 may be about 4:1 to about 6:1.

Meanwhile, the fourth sidewall trench 527 may be formed between the fourth gas supply region 570 and the first gas supply region 510. More specifically, the fourth sidewall trench 527 may be defined by the base plate 580, and the fourth sidewall 575 of the fourth gas supply region 570 and the first sidewall 515 of the first gas supply region 510 which face each other.

The fourth sidewall trench 527 may extend in the radial direction from the center of the base plate 580. That is, the fourth sidewall trench 527 may have a shape that extends in the radial direction.

Like the first sidewall trench 521, a depth of the fourth sidewall trench 527 may decrease in the radial direction from the center of the base plate 580. In the present exemplary embodiment, the depth of the fourth sidewall trench 527 increases toward the center of the base plate 580, and decreases toward the edge of the base plate 580.

In this case, like the first sidewall trench 521, the depth of the fourth sidewall trench 527 may continuously decrease in the radial direction from the center of the base plate 580. However, the present disclosure is not limited thereto, and the depth of the fourth sidewall trench 527 may decrease in a stepwise manner. For example, the depth of the fourth sidewall trench 527 may change in a stepwise manner.

A ratio between a maximum depth and a minimum depth of the fourth sidewall trench 527 may be about 4:1 to about 6:1, e.g., a ratio between a maximum depth and a minimum depth of the fourth sidewall trench 527 may be about 5:1. Specifically, the fourth sidewall trench 527 may have the first depth D1 which is a maximum depth adjacent to the center of the base plate 580, and the second depth D2 which is a minimum depth adjacent to the edge of the base plate 580. In this case, a ratio between the first depth D1 and the second depth D2 may be about 4:1 to about 6:1.

Meanwhile, a width in the circumferential direction of each of the first sidewall trench 521, the second sidewall trench 523, the third sidewall trench 525, and the fourth sidewall trench 527 increases in the radial direction from the center of the base plate 580. That is, a width of each of the first sidewall trench 521, the second sidewall trench 523, the third sidewall trench 525, and the fourth sidewall trench 527 increases in the radial direction from the center of the base plate 580.

In the present exemplary embodiment, the central trench 540 may be defined by the first inner wall 514 of the first gas supply region 510, the second inner wall 534 of the second gas supply region 530, the third inner wall 554 of the third gas supply region 550, and the fourth inner wall 574 of the fourth gas supply region 570. That is, the central trench 540 may be formed at the center of the gas supply unit 500 by being surrounded by the first inner wall 514, the second inner wall 534, the third inner wall 554, and the fourth inner wall 574. In this case, the central trench 540 may be connected with the first sidewall trench 521, the second sidewall trench 523, the third sidewall trench 525, and the fourth sidewall trench 527.

Referring to FIGS. 9 to 11, the central trench 540 may be formed to have a depth identical to the first depth D1 of the first sidewall trench 521. As discussed previously, in comparison with a structure having uniform depth of sidewalls, a volume of the central trench 540 increases, and pressure in the region decreases. In addition, according to Bernoulli's theorem, a flow velocity of gas increases in the region, and the amount of gas flowing to the region increases.

Figure 13:
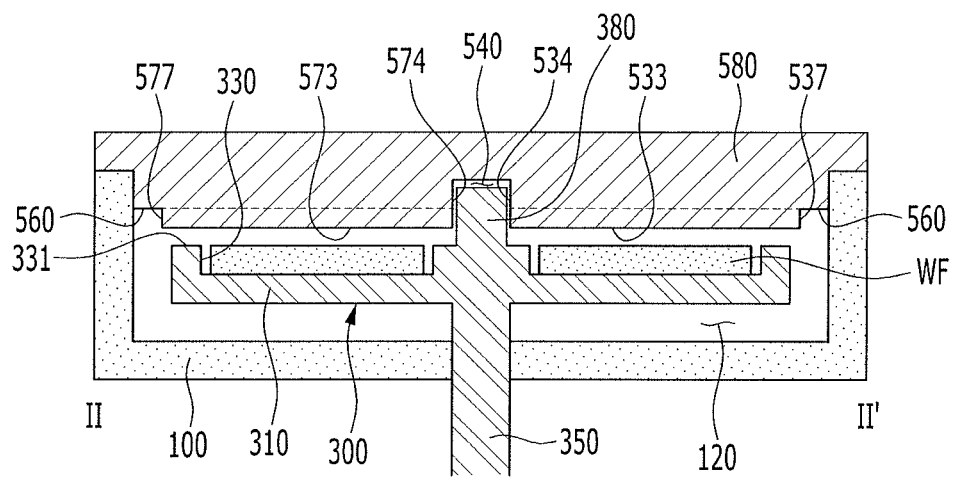
FIGS. 13 and 14 illustrate a modified embodiment in which the susceptor illustrated in FIGS. 2 and 3 has a modified shape.
Figure 14:
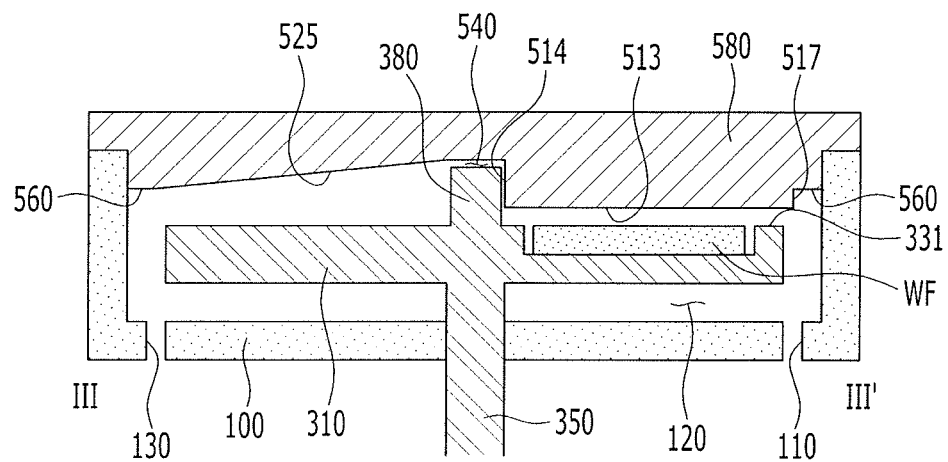

Referring back to FIGS. 2 and 3, the upper surface 331 of the susceptor 300 is positioned below the central trench 540. In this case, the central trench 540 may have a vacant space having a predetermined volume by the central trench 540 and the upper surface 331 of the susceptor 300 which face each other. However, the present disclosure is not limited thereto, and as illustrated in FIGS. 13 and 14, a protrusion portion 380 of the susceptor 300 may be inserted into the central trench 540.

Figure 15:
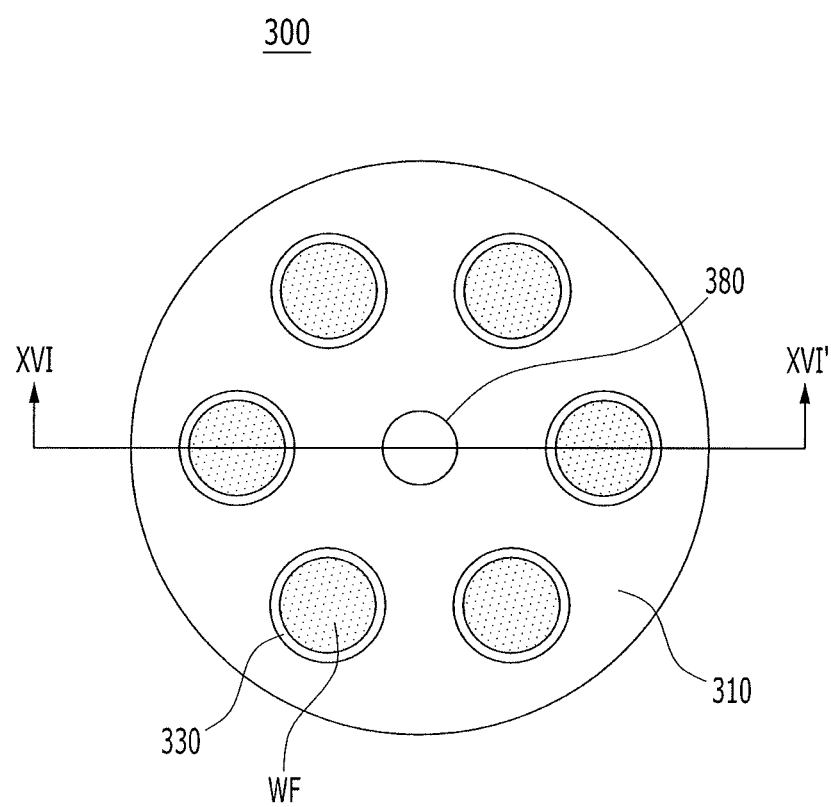
FIG. 15 illustrates a modified embodiment of the susceptor in FIG. 4.
Figure 16:
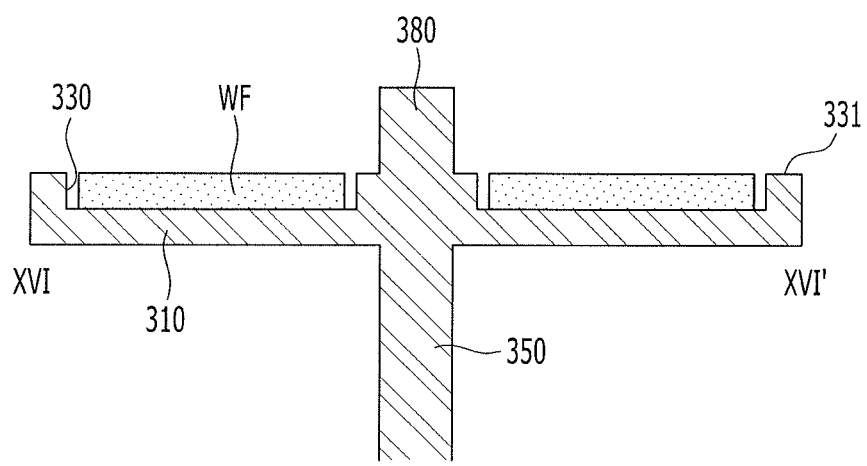
FIG. 16 illustrates a cross-sectional view taken along line XVI-XVI' in FIG. 15.

FIGS. 15 and 16 are views illustrating a modified embodiment of a susceptor according to the present exemplary embodiment.

Referring to FIGS. 15-16, the protrusion portion 380 may protrude toward the gas supply unit 500 from the upper surface 331 of the susceptor 300. As the protrusion portion 380 of the susceptor 300 is inserted into the central trench 540, a volume of the central trench 540 may be adjusted. As a result, the amount of gas flowing to the region in which the central trench 540 is positioned may be adjusted by the protrusion portion 380 of the susceptor 300.

Referring to FIGS. 6 and 7, the outer peripheral trench 560 may be formed to be adjacent to the edge of the base plate 580. The outer peripheral trench 560 may be formed in the circumferential direction of the base plate 580 outside the first gas supply region 510, the second gas supply region 530, the third gas supply region 550, and the fourth gas supply region 570. More specifically, the outer peripheral trench 560 may be defined by being surrounded by the first outer wall 517, the second outer wall 537, the third outer wall 557, the fourth outer wall 577, and an inner wall of the body 100 (see FIG. 2).

In this case, the outer peripheral trench 560 may be connected with the first sidewall trench 521, the second sidewall trench 523, the third sidewall trench 525, and the fourth sidewall trench 527, and may also be connected with the central trench 540.

Referring back to FIGS. 1 to 3, the first gas discharge port 110 and the second gas discharge ports 130 and 150 may be disposed to face the outer peripheral trench 560. That is, the first gas discharge port 110 and the second gas discharge ports 130 and 150 may be disposed below the outer peripheral trench 560.

The first gas discharge port 110 may be disposed adjacent to the first gas supply region 510. More specifically, the first gas discharge port 110 may be disposed to correspond to a center of the first outer wall 517 (see FIG. 6) of the first gas supply region 510. In this case, a second gas discharge pump (not illustrated) may be connected to the first gas discharge port 110. Therefore, the first gas GAS-1, the second gas GAS-2, or the fourth gas GAS-4, which moves along the first sidewall trench 521 and the fourth sidewall trench 527, may be discharged to the outside through the first gas discharge port 110 via the outer peripheral trench 560.

Meanwhile, the second gas discharge ports 130 and 150 may be disposed adjacent to the third gas supply region 550. More specifically, the second gas discharge ports 130 and 150 are disposed as a pair of discharge ports, the second gas discharge port 150 may be positioned between the second gas supply region 530 and the third gas supply region 550, and the second gas discharge port 130 may be positioned between the third gas supply region 550 and the fourth gas supply region 570.

In this case, the second gas discharge ports 130 and 150 may be connected with a third gas discharge pump (not illustrated). That is, the pair of second gas discharge ports 130 and 150 may be connected to the third gas discharge pump.

The second gas GAS-2 and the third gas GAS-3, which move along the second sidewall trench 523, may be discharged to the outside through the second gas discharge port 150. In addition, the second gas GAS-2, which moves through the outer peripheral trench 560, may also be discharged to the outside through the second gas discharge port 150.

Meanwhile, the third gas GAS-3 and the fourth gas GAS-4, which move along the third sidewall trench 525, may be discharged to the outside through the second gas discharge port 130. In addition, the fourth gas GAS-4, which moves through the outer peripheral trench 560, may also be discharged to the outside through the second gas discharge port 130.

Hereinafter, a thin film deposition apparatus according to a second exemplary embodiment of the present disclosure will be described with reference to FIGS. 17 to 22. In the description of the thin film deposition apparatus according to the present exemplary embodiment, a detailed description of constituent elements identical to those of the thin film deposition apparatus according to the aforementioned first exemplary embodiment will be omitted.

Figure 17:
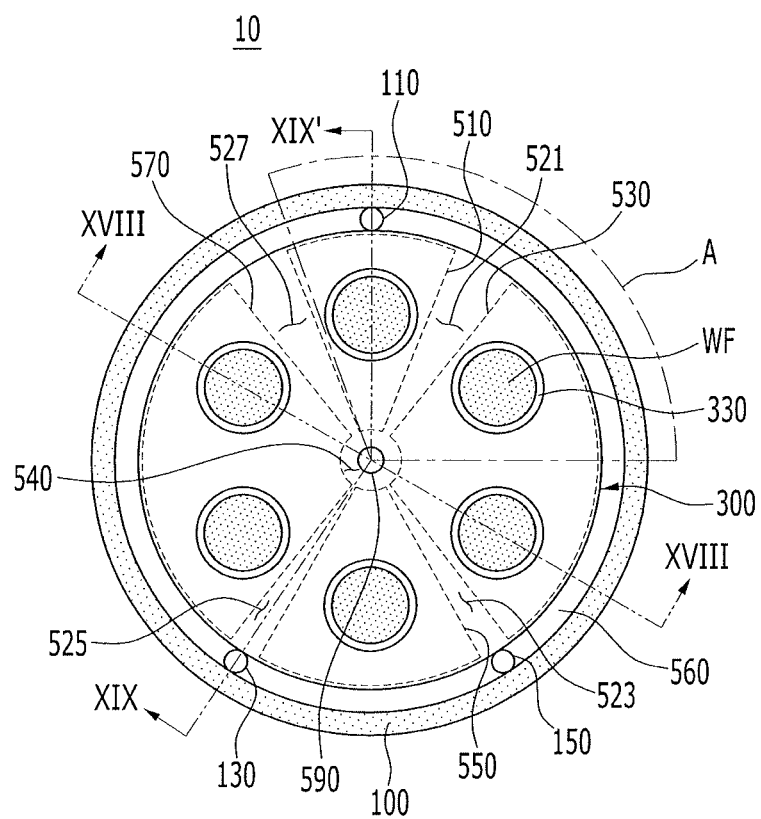
FIG. 17 illustrates a schematic top plan view of a thin film deposition apparatus according to a second exemplary embodiment.
Figure 18:
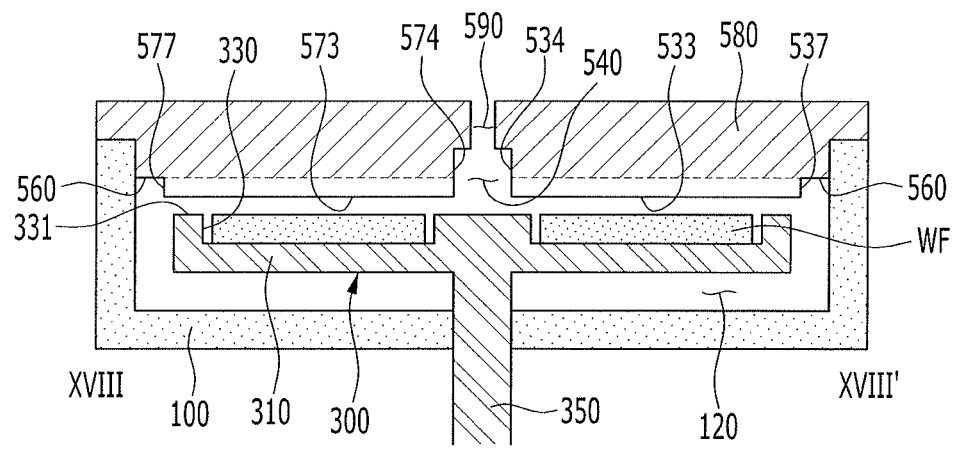
FIG. 18 illustrates a cross-sectional view taken along line XVIII-XVIII' in FIG. 17.
Figure 19:
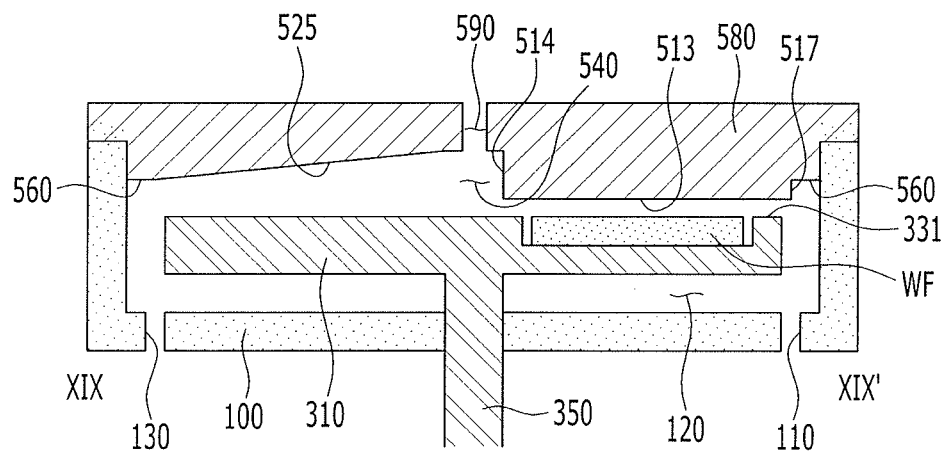
FIG. 19 illustrates a cross-sectional view taken along line XIX-XIX' in FIG. 17.
Figure 20:
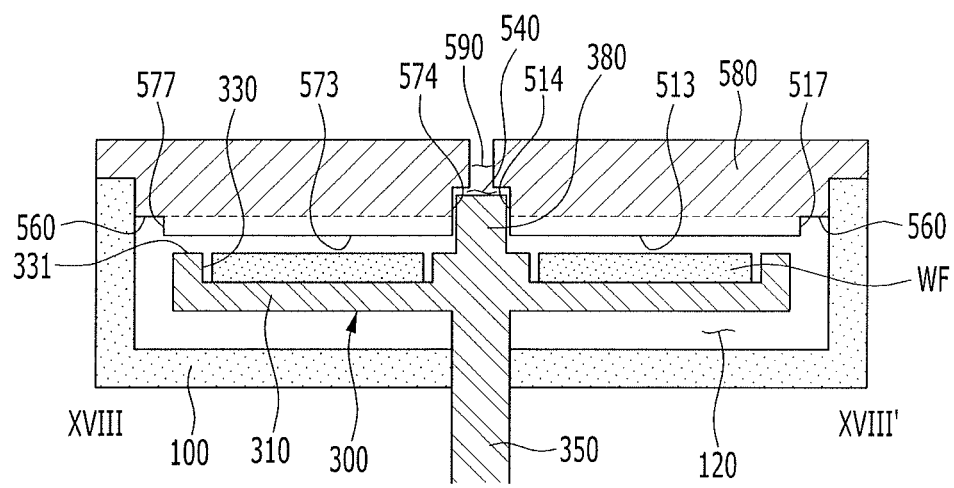
FIGS. 20 and 21 illustrate a modified embodiment in which a shape of the susceptor in FIGS. 18 and 19 is modified.
Figure 21:
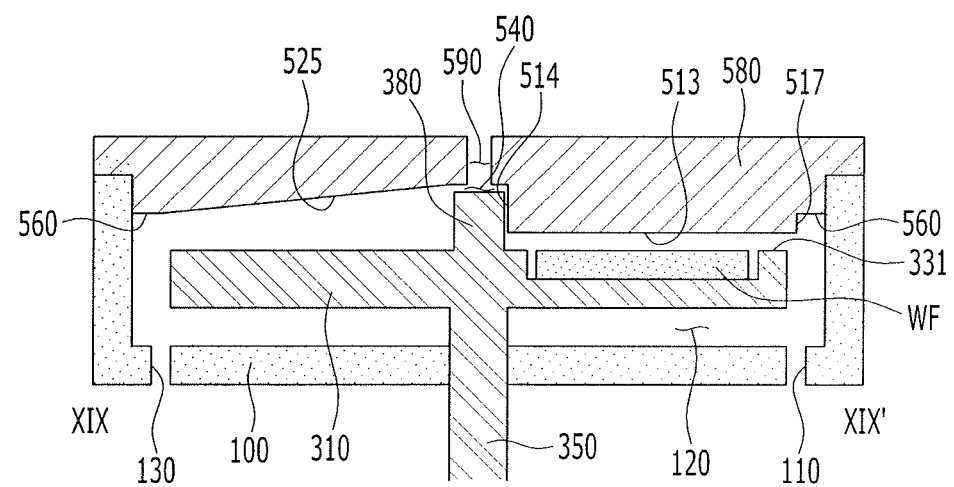
Figure 22:
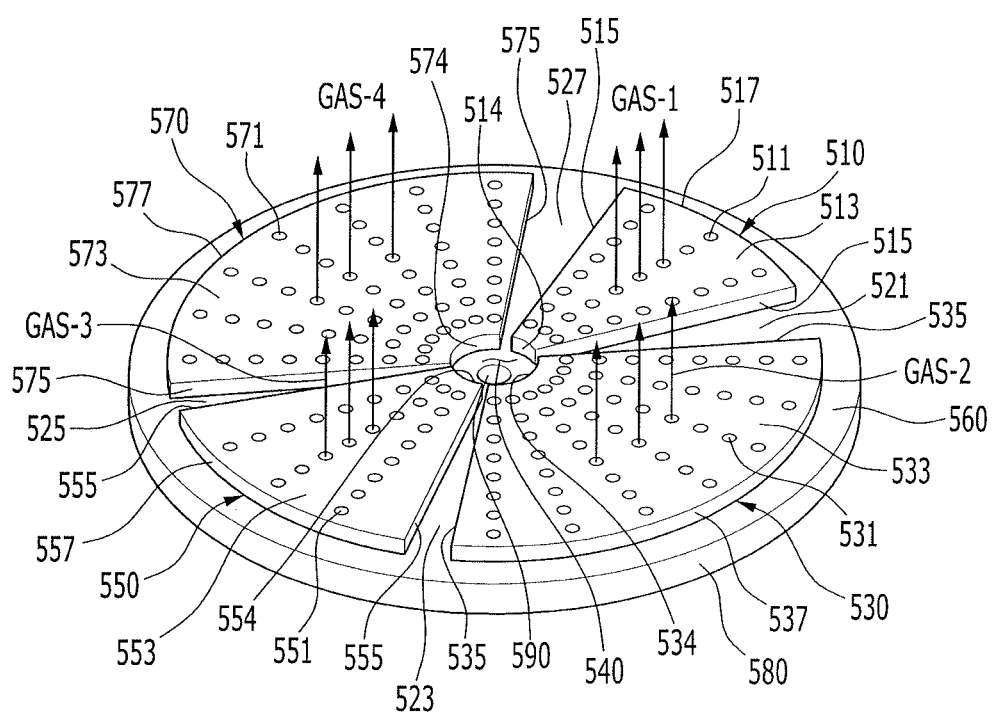
FIG. 22 illustrates a perspective view schematically illustrating a gas supply unit in FIG. 17.

FIG. 17 is a schematic top plan view of the thin film deposition apparatus according to the second exemplary embodiment, FIG. 18 is a cross-sectional view taken along line XVIII-XVIII' in FIG. 17, and FIG. 19 is a cross-sectional view taken along line XIX-XIX' in FIG. 17. FIGS. 20 and 21 illustrate a modified embodiment in which a shape of the susceptor in FIGS. 18 and 19 is modified, and FIG. 22 is a perspective view schematically illustrating the gas supply unit in FIG. 17.

Referring to FIGS. 17 to 22, in the present exemplary embodiment, a first through port 590 may be formed in the central trench 540 of the gas supply unit 500. The first through port 590 may penetrate the base plate 580.

The first through port 590 is formed at a center of the central trench 540, and may be connected with a first gas discharge pump positioned outside the gas supply unit 500. Therefore, the gases, which move along the first sidewall trench 521, the second sidewall trench 523, the third sidewall trench 525, the fourth sidewall trench 527, and the central trench 540, may be discharged to the outside through the first through port 590. That is, the first gas GAS-1, the second gas GAS-2, the third gas GAS-3, and the fourth gas GAS-4 may be discharged to the outside through the first through port 590.

Since the first gas discharge pump is connected to the central trench 540, the amount of gas flowing to the central trench 540 may increase. In addition, the amount of gas flowing to regions of the first sidewall trench 521, the second sidewall trench 523, the third sidewall trench 525, and the fourth sidewall trench 527, which are adjacent to the central trench 540, may increase. That is, when gas is discharged to the outside through the first through port 590 formed in the central trench 540 as described in the present exemplary embodiment, the amount of gas moving to the region close to the center of the base plate 580 may increase, and a thin film having a uniform thickness may be formed on the substrate WF.

Meanwhile, as a modified embodiment of the second exemplary embodiment, a curtain gas supply tube may be connected to the first through port 590 of the central trench 540. That is, in the modified embodiment of the second exemplary embodiment, the curtain gas supply tube may be connected instead of the first gas discharge pump.

The curtain gas supply tube may supply curtain gas, e.g., purge gas acting as a partition, to the central trench 540. The curtain gas may prevent the first gas GAS-1 supplied from the first gas supply region 510 and the third gas GAS-3 supplied from the third gas supply region 550 from being mixed together in the central trench 540. In this case, the curtain gas may perform similar functions to those of the second gas GAS-2 and the fourth gas GAS-4 supplied from the second gas supply region 530 and the fourth gas supply region 570.

Hereinafter, a thin film deposition method according to an exemplary embodiment of the present disclosure will be described. In the description of the thin film deposition method according to the present exemplary embodiment, a detailed description of constituent elements identical to those of the thin film deposition apparatus will be omitted.

First, the plurality of substrates WF may be disposed on the susceptor 300 positioned in the body 100 of the thin film deposition apparatus 10. The plurality of substrates WF may be disposed in the plurality of loading grooves 330, respectively, which is formed in the upper surface of the susceptor 300 in the circumferential direction.

After the plurality of substrates WF is disposed on the susceptor 300, the gas supply unit 500 is disposed to face the susceptor 300. In this case, the first to fourth gas supply regions 510, 530, 550, and 570 of the gas supply unit 500 may be disposed to face the substrate WF on the susceptor 300. That is, the first to fourth gases GAS-1, GAS-2, GAS-3, and GAS-4 injected through the first to fourth gas supply regions 510, 530, 550, and 570 may be injected toward the plurality of substrates WF.

After the susceptor 300 and the gas supply unit 500 are disposed to face each other, the susceptor 300 is rotated in the accommodating groove 120. In this case, the gas supply unit 500 may inject gas while the susceptor 300 rotates. More specifically, the first gas supply region 510 may inject the first gas GAS-1 toward the susceptor 300, and the second gas supply region 530 may inject the second gas GAS-2. Further, the third gas supply region 550 may inject the third gas GAS-3 toward the susceptor 300, and the fourth gas supply region 570 may inject the fourth gas GAS-4.

According to the present exemplary embodiment, the substrate WF disposed on the susceptor 300 is rotated by the susceptor 300. For example, when the substrate WF rotates clockwise, the substrate WF passes sequentially below the first to fourth gas supply regions 510, 530, 550, and 570.

Therefore, the first to fourth gases GAS-1, GAS-2, GAS-3, and GAS-4 sequentially reach the substrate WF. That is, each of the first gas GAS-1, which is the source gas, the second gas GAS-2, which is the purge gas, the third gas GAS-3, which is the reactant gas, and the fourth gas GAS-4, which is the purge gas, sequentially reach, e.g., each of, the substrates WF. Meanwhile, in the present exemplary embodiment, the process of allowing the first to fourth gases GAS-1, GAS-2, GAS-3, and GAS-4 to sequentially reach the substrate WF may be repeated at least once.

In a process of forming the dielectric film by the thin film deposition method according to the present exemplary embodiment, TEMAZ [tetra-ethyl-methyl amino zirconium; $Zr(N(CH_3)(C_2H_5))_4$], which is the first gas GAS-1, may be injected onto the substrate WF, and then $O_3$, which is the third gas GAS-3, may be injected. Further, before the first gas GAS-1 and the third gas GAS-3 are injected, the fourth gas GAS-4 and the second gas GAS-2, which are the purge gas, may be injected onto the substrate WF.

In this case, with the shapes and the arrangement of the trenches 521, 523, 525, 527, 540, and 560 of the first to fourth gas supply regions 510, 530, 550, and 570, the gases, which are injected from the first to fourth gas supply regions 510, 530, 550, and 570 to the susceptor 300, may uniformly move from the center of the substrate WF to the edge of the substrate WF. Specifically, the gases may move from the center of the substrate WF toward the central region of the susceptor 300 and the edge region of the susceptor 300, and in the direction which intersects an imaginary line that connects the central region of the susceptor 300 and the edge of the susceptor 300. Therefore, the gases may be uniformly deposited onto the substrate WF.

Meanwhile, the remaining gases, among the first to fourth gases GAS-1, GAS-2, GAS-3, and GAS-4, which are not stacked on the substrate WF, may be discharged downward from the susceptor 300. Specifically, the remaining gases may move downward from the susceptor 300, and may be discharged to the outside through the first gas discharge port 110 and the second gas discharge ports 130 and 150. In addition, the gas moving to the central trench 540 may also be discharged to the outside through the first through port 590 formed in the central trench 540.

According to the thin film deposition apparatus according to the exemplary embodiment of the present disclosure, the depths of the first to fourth sidewall trenches 521, 523, 525, and 527, which are formed between the first to fourth gas supply regions 510, 530, 550, and 570, are increased toward the center of the base plate 580, and as a result, a thin film having a uniform thickness may be formed on the substrate WF.

By way of summation and review, one method of thin film deposition includes, for example, supply of source gas and reactant gas from an upper side of a substrate by using single type thin film deposition equipment having a gas shower head provided at an upper and central side of a vacuum container, and discharge of unreacted source gas, unreacted reactant gas, and reaction by-products from a lower side of a treatment container. However, in this film deposition method, gas exchange is carried out by purge gas over a comparatively long period of time when the source gas is replaced by the reactant gas and the reactant gas is replaced by the source gas, and the time required for deposition is increased because the cycles are performed several hundred times.

In another thin film deposition method, an apparatus has been proposed in which a plurality of wafers is disposed on a substrate support at an equal interval in a rotation direction, source gas discharge nozzles and reactant gas discharge nozzles are disposed at equal intervals in the rotation direction so as to face the substrate support, purge gas nozzles are disposed between these nozzles, and thin films are deposited by horizontally rotating the substrate support. In this case, gas exchange between the source gas and the reactant gas and gas exchange by the purge gas are not required, and as a result, high throughput may be realized. However, the source gas and the reactant gas may not be uniformly deposited onto the wafers.

In contrast, the present disclosure has been made in an effort to provide a gas supply unit and a thin film deposition apparatus capable of enabling a thin film formed by a reaction between a source gas and a reactant gas to be uniformly deposited onto a substrate. That is, according to the present exemplary embodiments, a thin film, which is formed by a reaction between a source gas and a reactant gas, may be formed on a substrate while having a uniform thickness.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A gas supply unit, comprising:
   a base plate having first and second surfaces opposite to each other;
   a plurality of gas supply regions protruding from the first surface of the base plate, the plurality of gas supply regions being arranged on the base plate in a circumferential direction; and
   a plurality of sidewall trenches on the first surface of the base plate and defined by facing sidewalls of adjacent gas supply regions of the plurality of gas supply regions,
   wherein a distance between the first and second surfaces of the base plate increases in a radial direction from a center of the base plate in each of the plurality of sidewall trenches, such that each of the plurality of sidewall trenches has a depth that decreases in the radial direction from the center of the base plate.

2. The gas supply unit as claimed in claim 1, further comprising a central trench at the center of the base plate, the central trench being connected to the plurality of sidewall trenches, and being surrounded by inner walls of the plurality of gas supply regions which are directed toward the center of the base plate.

3. The gas supply unit as claimed in claim 2, wherein a first through port, which penetrates the base plate, is in the central trench.

4. The gas supply unit as claimed in claim 3, further comprising a first gas discharge pump connected to the first through port.

5. The gas supply unit as claimed in claim 1, wherein:
   the plurality of gas supply regions include respective lower surfaces facing away from the first surface of the base plate,
   each of the plurality of sidewall trenches has a first depth positioned adjacent to the center of the base plate, and a second depth positioned adjacent to an edge of the base plate, the first and second depths being measured from the first surface of the base plate to a lower surface of an adjacent gas supply region of the plurality of gas supply regions, and
   a ratio between the first depth and the second depth is about 4:1 to about 6:1.

6. The gas supply unit as claimed in claim 1, wherein the plurality of gas supply regions includes first to fourth gas supply regions, which are sequentially disposed in the circumferential direction, so as to be spaced apart from each other.

7. The gas supply unit as claimed in claim 6, wherein an area ratio between the first gas supply region and the third gas supply region is about 1:1.4 to about 1:2.

8. A thin film deposition apparatus, comprising:
   a body with an accommodating groove therein;
   a rotatable susceptor in the accommodating groove, the rotatable susceptor supporting a plurality of substrates; and
   a gas supply unit coupled to an upper portion of the body, the gas supply unit facing the rotatable susceptor to inject a plurality of gases toward the susceptor,
   wherein the gas supply unit includes:
      a base plate having first and second surfaces opposite to each other,
      a plurality of gas supply regions protruding from the first surface of the base plate, the plurality of gas supply regions being arranged on the base plate in a circumferential direction, and
      a plurality of sidewall trenches on the first surface of the base plate and defined by facing sidewalls of adjacent gas supply regions of the plurality of gas supply regions,
      wherein a distance between the first and second surfaces of the base plate increases in a radial direction from a center of the base plate in each of the plurality of sidewall trenches, such that each of the plurality of sidewall trenches has a depth that decreases in the radial direction from the center of the base plate.

9. The thin film deposition apparatus as claimed in claim 8, further comprising:
   a central trench at the center of the base plate and connected to the plurality of sidewall trenches, the central trench being surrounded by inner walls of the plurality of gas supply regions which are directed toward the center of the base plate,
   wherein a first through port, which penetrates the base plate, is in the central trench.

10. The thin film deposition apparatus as claimed in claim 9, further comprising a first gas discharge pump connected to the first through port.

11. The thin film deposition apparatus as claimed in claim 8, wherein:
    each of the plurality of sidewall trenches has a first depth positioned adjacent to the center of the base plate, and a second depth positioned adjacent to an edge of the base plate, and
    a ratio between the first depth and the second depth is about 4:1 to about 6:1.

12. The thin film deposition apparatus as claimed in claim 8, wherein:
    the plurality of gas supply regions includes first to fourth gas supply regions which are sequentially disposed in the circumferential direction so as to be spaced apart from each other, and inject first to fourth gases, respectively, and
    an area ratio between the first gas supply region and the third gas supply region is 1:1.4 to 1:2.

13. The thin film deposition apparatus as claimed in claim 12, wherein
    the first gas is a source gas, the second gas and the fourth gas are purge gases, and the third gas is a reactant gas to react with the source gas.

14. The thin film deposition apparatus as claimed in claim 13, wherein the first gas includes Zr, and the third gas includes at least one of $O_3$, $O_2$, and $H_2O$.

15. The thin film deposition apparatus as claimed in claim 8, further comprising:
    an outer peripheral trench which is connected with the plurality of sidewall trenches, and formed in the circumferential direction so as to be adjacent to an edge of the base plate,
    wherein a plurality of gas discharge ports, which penetrates the accommodating groove, is formed in the accommodating groove so as to face the outer peripheral trench.

16. A gas supply unit, comprising:
  a base plate having first and second surfaces opposite to each other;
  a plurality of gas supply regions protruding from the first surface of the base plate, the plurality of gas supply regions being arranged on the base plate in a circumferential direction; and
  a plurality of sidewall trenches on the first surface of the base plate, the plurality of sidewall trenches and the plurality of gas supply regions being alternately arranged along the circumferential direction of the base plate,
  wherein a distance between the first and second surfaces of the base plate increases in a radial direction from a center of the base plate in each of the plurality of sidewall trenches, such that each of the plurality of sidewall trenches has a decreasing depth in the radial direction from the center of the base plate toward an edge of the base plate.

17. The gas supply unit as claimed in claim 16, further comprising a central trench at the center of the base plate, and a peripheral trench around an edge of the base plate, the central trench and the peripheral trench being in fluid communication with each of the plurality of sidewall trenches.

18. The gas supply unit as claimed in claim 17, wherein the decreasing depth of each of the plurality of sidewall trenches is continuous from the central trench to the peripheral trench.

19. The gas supply unit as claimed in claim 16, wherein each of the plurality of sidewall trenches is continuous from the center of the base plate toward an edge of the base plate, the depth of the each of the plurality of sidewall trenches being measured from the first surface of the base plate to a surface of an adjacent gas supply region of the plurality of gas supply regions that faces away from the first surface of the base plate.

20. The gas supply unit as claimed in claim 16, wherein, in each of the plurality of gas supply regions, a surface in direct contact with the first surface of the base plate and a surface facing away from the first surface of the base plate have a same shape.

* * * * *